United States Patent
Nakamura et al.

(10) Patent No.: US 9,615,461 B2
(45) Date of Patent: Apr. 4, 2017

(54) WIRING MODULE INCLUDING WIRING SUBSTRATE HAVING BORDER PORTION SEPARATING TWO SIDE METALLIC FOILS AND MANUFACTURING METHOD OF WIRING MODULE

(71) Applicant: SHINKO ELECTRIC INDUSTRIES CO., LTD., Nagano (JP)

(72) Inventors: Atsushi Nakamura, Nagano (JP); Tsukasa Nakanishi, Nagano (JP); Takayuki Matsumoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/161,579

(22) Filed: May 23, 2016

(65) Prior Publication Data

US 2016/0270231 A1    Sep. 15, 2016

Related U.S. Application Data

(63) Continuation of application No. 13/893,499, filed on May 14, 2013, now Pat. No. 9,392,692.

(30) Foreign Application Priority Data

May 25, 2012    (JP) .................................. 2012-119750

(51) Int. Cl.
    *H05K 7/00*    (2006.01)
    *H05K 1/18*    (2006.01)
    (Continued)

(52) U.S. Cl.
    CPC ......... *H05K 1/181* (2013.01); *H01L 23/3107* (2013.01); *H01L 23/49541* (2013.01);
    (Continued)

(58) Field of Classification Search
    CPC ...... H05K 1/181; H05K 1/09; H01L 23/3107; H01L 23/49541; H01L 24/49; H01L 33/54
    (Continued)

(56) References Cited

U.S. PATENT DOCUMENTS

2009/0278243 A1    11/2009    Chuang et al.

FOREIGN PATENT DOCUMENTS

JP    2002-329755    11/2002
JP    2009-81214    4/2009
(Continued)

OTHER PUBLICATIONS

Office Action dated Sep. 19, 2016 issued with respect to the corresponding Tiwanese Patent Application No. 102117167.

*Primary Examiner* — Tremesha S Willis
(74) *Attorney, Agent, or Firm* — IPUSA, PLLC

(57) ABSTRACT

A wiring substrate includes a resin substrate in which first and second through holes are formed, a metallic foil on one surface of the resin substrate coating the through holes and separated into first and second side metallic foils by a border, a first connecting portion formed by a plating film inside the first through hole, a second connecting portion formed by a plating film inside the second through hole, a first slit facing the border and penetrating through the metallic foil and the first connecting portion, a second slit facing the border and penetrating through the metallic foil and the second connecting portion, first and second plating layers on front surfaces of the first and second side metallic foils, bottom surfaces of the first and second connecting portions, and side surfaces inside the first and second slits of the first and second side metallic foils.

5 Claims, 9 Drawing Sheets

(51) Int. Cl.
*H05K 1/11* (2006.01)
*H05K 3/42* (2006.01)
*H01L 23/31* (2006.01)
*H01L 23/495* (2006.01)
*H01L 23/00* (2006.01)
*H01L 33/54* (2010.01)
*H01L 33/62* (2010.01)
*H05K 1/02* (2006.01)
*H05K 1/03* (2006.01)
*H05K 1/09* (2006.01)
*H01L 33/48* (2010.01)
*H05K 1/05* (2006.01)

(52) U.S. Cl.
CPC ............. *H01L 24/49* (2013.01); *H01L 33/54* (2013.01); *H01L 33/62* (2013.01); *H05K 1/0296* (2013.01); *H05K 1/0313* (2013.01); *H05K 1/09* (2013.01); *H05K 1/112* (2013.01); *H05K 1/113* (2013.01); *H05K 1/115* (2013.01); *H05K 3/42* (2013.01); *H05K 3/427* (2013.01); *H01L 33/48* (2013.01); *H01L 2224/13* (2013.01); *H01L 2224/48091* (2013.01); *H01L 2224/48245* (2013.01); *H01L 2924/00014* (2013.01); *H01L 2924/14* (2013.01); *H05K 1/056* (2013.01); *H05K 1/189* (2013.01); *H05K 2201/10106* (2013.01); *H05K 2203/1545* (2013.01); *Y10T 29/49165* (2015.01)

(58) Field of Classification Search
USPC ................. 361/779, 777; 174/250, 251, 253, 174/255–259
See application file for complete search history.

(56) References Cited

FOREIGN PATENT DOCUMENTS

| | | |
|---|---|---|
| JP | 2009-147210 | 7/2009 |
| TW | 200947654 | 11/2009 |

(A)

(B)

(C)

(D)

(A)

(B)

(C)

(D)

us 9,615,461 B2

WIRING MODULE INCLUDING WIRING SUBSTRATE HAVING BORDER PORTION SEPARATING TWO SIDE METALLIC FOILS AND MANUFACTURING METHOD OF WIRING MODULE

CROSS-REFERENCE TO RELATED APPLICATIONS

This application is a continuation application filed under 35 U.S.C. 111(a) claiming the benefit under 35 U.S.C. 120 of U.S. patent application Ser. No. 13/893,499 filed on May 14, 2013, which is based upon and claims the benefit of priority of the prior Japanese Patent Application No. 2012-119750, filed on May 25, 2012, the entire contents of which are incorporated herein by reference.

FIELD

The embodiments discussed herein are related to a wiring substrate and a manufacturing method of the wiring substrate.

BACKGROUND

For example, there is a circuit board including a ceramic board having first and second surfaces facing each other, a wiring conductor that is formed on a first surface of the ceramic board and includes a connecting area, which is made of tungsten or molybdenum as a major component and to which a lead terminal is joined via silver solder, and a copper or copper alloy layer formed on a second surface of the ceramic board, as in Japanese Laid-open Patent Application No. 2009-147210.

SUMMARY

According to an aspect of the embodiment, a wiring substrate includes a resin substrate in which a first through hole and a second through hole are formed; a metallic foil that is formed on one surface of the resin substrate, coats the first and second through holes, and is separated into a first side metallic foil and a second side metallic foil by a border; a first connecting portion formed by a plating film connected to the first side metallic foil inside the first through hole; a second connecting portion formed by a plating film connected to the second side metallic foil inside the second through hole; a first slit formed so as to face the border across the first connecting portion and penetrate through the metallic foil and the first connecting portion; a second slit formed so as to face the border across the second connecting portion and penetrate through the metallic foil and the second connecting portion; a first plating layer that is formed on a front surface of the first side metallic foil, a bottom surface of the first connecting portion, and a side surface inside the first slit of the first side metallic foil; and a second plating layer that is formed on a front surface of the second side metallic foil, a bottom surface of the second connecting portion, and a side surface inside the second slit of the second side metallic foil.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

In the above example of the circuit board, because the wiring conductor is printed on the ceramic board, there is a limit in narrowing gaps among the wiring conductors in conformity with miniaturization of electronic parts.

In order to follow the miniaturization of electronic parts, it is preferable to form plural wirings with interposing a minute gap.

Preferred embodiments of the present invention will be explained with reference to accompanying drawings.

Where the same reference symbols are attached to the same parts, repeated description of the parts is omitted.

Hereinafter, wiring substrates of comparative examples 1 and 2 are illustrated before describing a wiring substrate and a manufacturing method of the wiring substrate of embodiments.

Comparative Example 1

Figure 1:
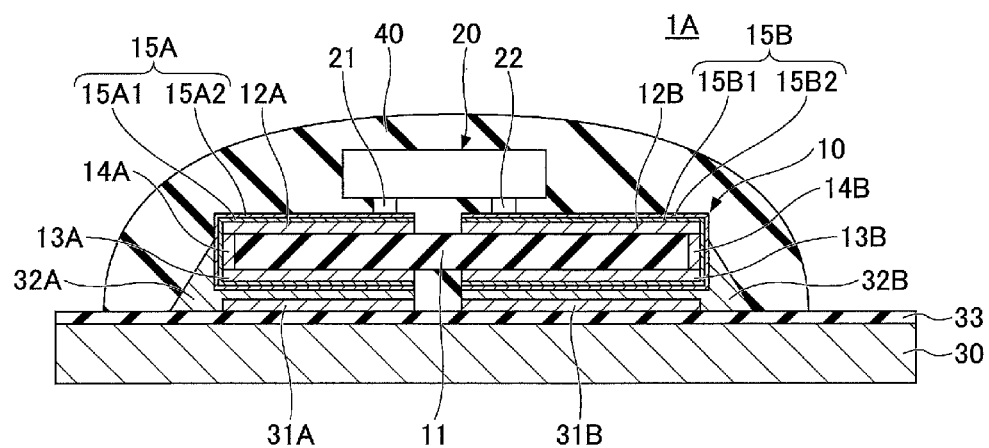
FIG. 1 is a cross-sectional view of a LED module 1A of a comparative example 1.

FIG. 1 is a cross-sectional view of a light emitting diode (LED) module 1A of the comparative example 1.

The LED module 1A of the comparative example 1 includes a wiring substrate 10, a LED 20, a metallic plate 30, and a sealing resin 40.

The wiring substrate 10 includes a ceramic board 11, wiring layers 12A and 12B, electrodes 13A and 13B, connecting portions 14A and 14B, and plating layers 15A and 15B. The wiring substrate 10 is connected to the wiring layers 31A and 31B of the metallic plate 30 while the LED 20 is mounted on the wiring substrate 10. The LED 20 and the wiring substrate 10 are coated by a sealing resin 40 on the metallic plate 30.

A ceramic board 11 is made of ceramic, for example, alumina or aluminum nitride. The ceramic board 11 is used to mount the LED 20 on it.

The wiring layers 12A and 12B are formed on an upper surface of the ceramic board 11. Referring to FIG. 1, the two wiring layers 12A and 12B are formed while the two wiring layers 12A and 12B are separated each other. The wiring layers 12A and 12B are formed on an upper surface of the ceramic board 11 by printing, for example, a silver paste. The reason why the wiring layers 12A and 12B are formed by printing the silver paste is because the wiring layers 12A and 12B can be formed relatively at a low cost.

The electrodes 13A and 13B are formed on the lower surface of the ceramic board 11. Referring to FIG. 1, the two wiring layers 12A and 12B are formed while the two wiring layers 12A and 12B are separated each other. For example, the electrodes 13A and 13B may be formed by printing a silver paste on a lower surface of the ceramic board 11. The reason why the electrodes 13A and 13B are formed by printing the silver paste is that the electrodes 13A and 13B are formed in a manner similar to the wiring layers 12A and 12B.

The connecting portions 14A and 14B are formed on a side surface of the ceramic board 11. Referring to FIG. 1, the two connecting portions 14A and 14B connects the two wiring layers 12A and 12B to the two electrodes 13A and 13B. Said differently, the wiring layer 12A and the electrode 13A on the left side of the FIG. 1 are connected via the connecting portion 14A. Further, the wiring layer 12B and the electrode 13B on the right side of the FIG. 1 are connected via the connecting portion 14B.

For example, the connecting portions 14A and 14B may be formed by printing a silver paste on the side surface of the ceramic board 11.

The plating layers 15A and 15B are formed on the surfaces of the wiring layer 12A and 12B, the electrodes 13A and 13B, and the connecting portions 14A and 14B, respectively. The plating layer 15A has a double-layered structure of a nickel plating layer 15A1 and a gold plating layer 15A2. The plating layer 15B has a double-layered structure of a nickel plating layer 15B1 and a gold plating layer 15B2.

The nickel plating layer 15A1 may be provided on the surfaces of the wiring layer 12A, the electrode 13A, and the connecting portion 14A by, for example, an electrolytic plating process. Further, the gold plating layer 15A2 is formed by providing the gold plating film on the surface of the nickel plating layer 15A1 by, for example, the electrolytic plating process.

The nickel plating layer 15B1 may be provided on the surfaces of the wiring layer 12B, the electrode 13B, and the connecting portion 14B by, for example, the electrolytic plating process. Further, the gold plating layer 15B2 is formed by providing the gold plating film on the surface of the nickel plating layer 15B1 by, for example, the electrolytic plating process.

The LED 20 includes terminals 21 and 22 and is manufactured by a semiconductor manufacturing technique. The terminal 21 is connected to the wiring layer 12A on the left side, and the terminal 22 is connected to the wiring layer 12B on the right side. The terminals 21 and 22 are, for example, a bump of solder, gold, or the like. When the terminals 21 and 22 are made of the solder, it is sufficient to connect to the wiring layers 12A and 12B by melting the solder. Meanwhile, if the terminals 21 and 22 are made of gold bumps, it is sufficient to connect to the wiring layers 12A and 12B by pressure bonding. The LED 20 is flip-chip mounted on the wiring substrate 10 by the terminals 21 and 22.

The metallic plate 30 is a plate-like member made of a metal such as aluminum, copper, or the like. A resin layer 33 is formed on the upper surface of the metallic plate 30. The wiring layers 31A and 31B are formed on the resin layer 33.

For example, the resin layer 33 is formed by laminating (adhering) an epoxy resin onto the upper surface of the metallic plate 30.

The wiring layers 31A and 31B are formed on an upper surface of the resin layer 33 by printing, for example, the silver paste. Referring to FIG. 1, the two wiring layers 31A and 31B corresponding to the two electrodes 13A and 13B are illustrated.

The electrodes 13A and 13B on the lower surface of the ceramic board 11 are connected to the wiring layers 31A and 31B by the solder 32A and 32B. Actually, the electrodes 13A and 13B and the connecting portions 14A and 14B are connected to the wiring layers 31A and 31B via the plating layers 15A and 15B by the solder 32A and 32B.

A reason why the connecting portions 14A and 14B are connected to the wiring layers 31A and 31B by the solder 32A and 32B in addition to the electrodes 13A and 13B on the lower surface of the ceramic board 11 is to improve reliability of the connections by the solder by increasing connection strength by the solder 32A and 32B.

The solder 32A and 32B connect the electrodes 13A and 13B and the lower portions of the connecting portions 14A and 14B to the wiring layers 31A and 31B. The solder 32A and 32B are, for example, lead-free solder such as SnAgCu solder containing tin (Sn), silver (Ag), and copper (Cu), SnCu solder containing tin (Sn) and copper (Cu), and SnZnAl solder containing tin (Sn), zinc (Zn), and aluminum (Al), or the like.

For example, the sealing resin 40 may be formed by adding fluorescent material to a silicone resin or an epoxy resin. By molding or potting using the resin as described above, the LED 20 is sealed on the metallic plate 30. The wiring substrate 10 is sealed between the LED 20 and the metallic plate 30.

In the LED module 1A of the comparative example 1, one of the two wiring layers 31A and 31B is connected to the positive electrode terminal of a power source, and the other one of the wiring layers 31A and 31B is connected to the negative electrode terminal of the power source. Thus, electric power is supplied to the LED 20 via the wiring substrate 10 to thereby light the LED 20.

At this time, heat generated by the LED 20 is transferred from the wiring substrate 10 to the metallic plate 30. Then, heat is radiated by the metallic plate. Thus, the LED 20 is cooled.

Along with the miniaturization of the LED 20, the distance between the terminals 21 and 22 is shortened.

Therefore, it is preferable to shorten a gap between the two wiring layers 12A and 12B of the wiring substrate 10 (finely arranging the two wiring layers).

However, the two wiring layers 12A and 12B formed on the surface of the ceramic board 11 is mutually insulated. Therefore, there is a limit in narrowing the gap between the two wiring layers 12A and 12B (finely arranging the two wiring layers) by formation using printing.

Further, it can be considered to shorten the gap between the two wiring layers 12A and 12B by forming the wiring layers 12A and 12B using a semiadditive method. However, with the semiadditive method, electroless plating and electrolytic plating are performed. Therefore, there is a problem that the manufacturing cost of the LED module 1A increases.

Next, an Integrated Circuit (IC) module 1B of a comparative example 2 is described.

Comparative Example 2

Figure 2:
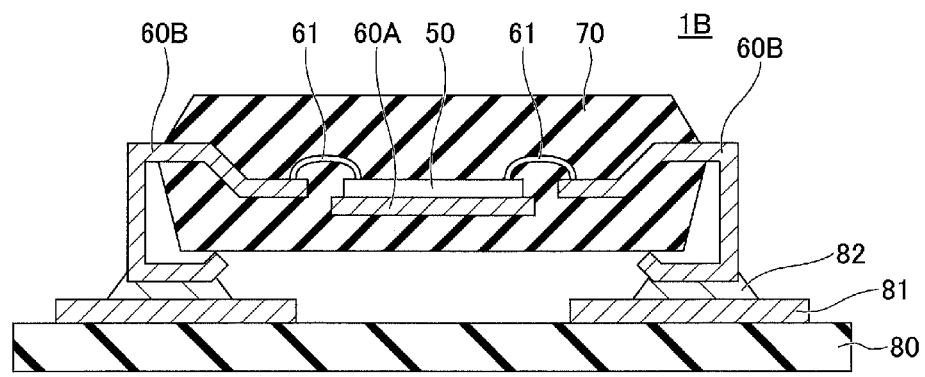
FIG. 2 is a cross-sectional view of an IC module 1B of a comparative example 2.

FIG. 2 is a cross-sectional view of an IC module 1B of the comparative example 2.

The IC module 1B includes an IC chip 50, a stage 60A, a lead 60B, a molding resin 70, and a circuit board 80.

The IC chip 50 is manufactured using a semiconductor manufacturing technique. The IC chip 50 has a predetermined operating function. The IC chip 50 is mounted on the stage 60A and connected to the lead 60B by a bonding wire 61. Referring to FIG. 2, two leads 60B and two bonding wires 61 are illustrated in FIG. 2. However, there may exist many leads 60B and many bonding wires.

The stage 60A and the lead 60B can be obtained by cutting and removing a frame of a lead frame. The stage 60A is a plate-like rectangular member in its plan view. The lead 60B is substantially shaped like a letter of "U" in its cross-sectional view.

The IC chip 50 is mounted on the stage 60A of the lead frame including the stage 60A and the lead 60B. While the IC chip 50 is connected to the one end of the lead 60B by the bonding wire 61, the IC chip 50 is coated by the molding resin 70. Thereafter, the frame of the lead frame is cut and removed. After the frame is removed, the IC module 1B illustrated in FIG. 2 is obtainable.

The other end of the lead 60B is connected to a wiring layer 81 of the circuit board 80 by solder 82.

The molding resin 70 is made of, for example, an epoxy resin. The molding resin 70 is manufactured by insert molding so as to coat the IC chip 50, the stage 60A, and a side of one end of the lead 60B.

The circuit board 80 may be made of a glass epoxy resin under the standard of Flame Retardant 4 (FR4). The wiring layer 81 is formed on the surface of the circuit board 80.

In the IC module 1B of the comparative example 2 described above, the IC chip 50 is connected to an external circuit via the bonding wire 61, the lead 60B, and the wiring layer 81 to thereby perform a predetermined operation.

In the IC module 1B of the comparative example 2, along with the miniaturization of the IC chip 50, the distance between the stage 60A and the lead 60B is shortened and many gaps between the leads 60B are shortened.

However, the stage 60A and the lead 60B are formed by punching out a metallic plate such as a hoop by a steel stamp. Therefore, there is a problem that the distance between the stage 60A and the lead 60B and the distance between the leads 60B are limited to be shortened (limited to be finely arranged).

As described, there is a problem that microfabrication of the stage 60A and the lead 60B (finely arranging the stage 60A and the lead 60B) are difficult in the LED module 1A of the comparative example 1 and the IC module 1B of the comparative example 2.

Therefore, in the embodiment described below, explanation is given to the wiring structure and the manufacturing method of the wiring structure solving these problems. In the following first to third embodiments, the same reference symbols are given to constitutional elements of the first to third embodiments as those of the comparative examples 1 and 2, and explanation of these constitutional elements is omitted.

[a] First Embodiment

Figure 3A:
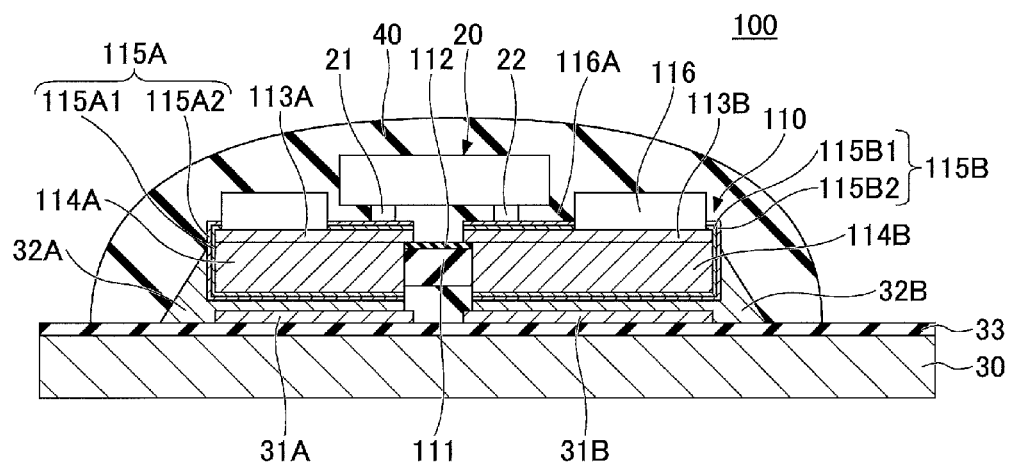
FIG. 3A and FIG. 3B are a cross-sectional view and a plan view of a LED module 100 of a first embodiment.
Figure 3B:
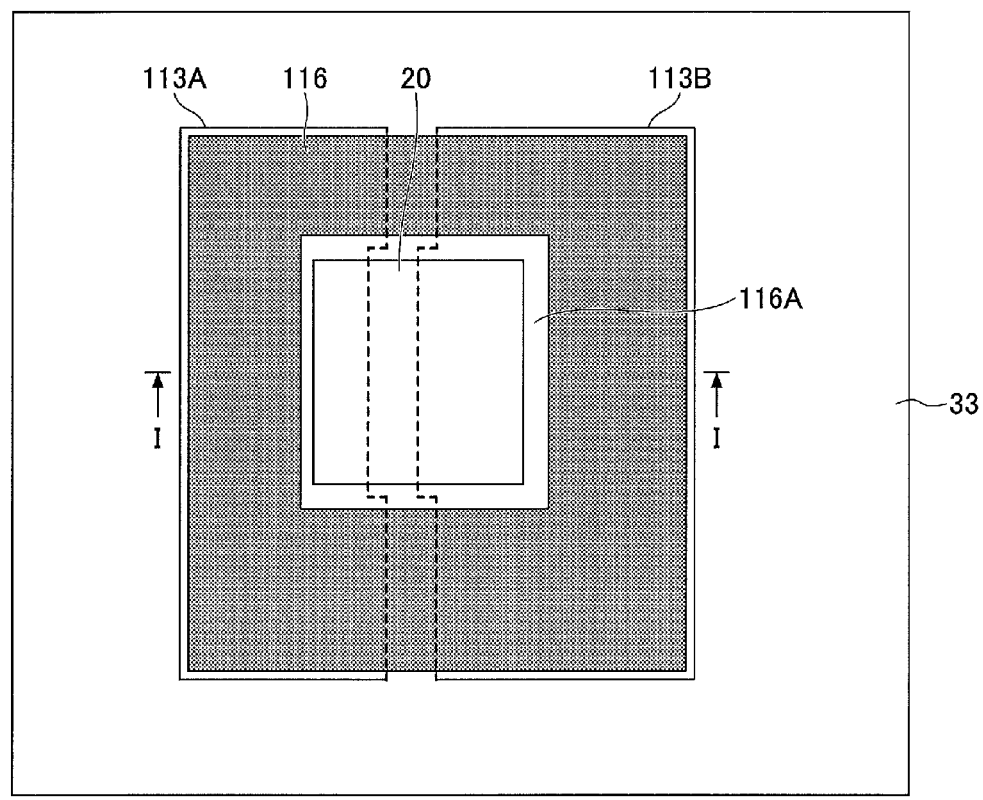

FIG. 3A and FIG. 3B are a cross-sectional view and a plan view of a LED module 100 of the first embodiment. FIG. 3A illustrates a cross-sectional structure of a LED module 100 of the first embodiment, and FIG. 3B illustrates a plan structure of the LED module 100 of the first embodiment. FIG. 3A is a view taken along a line I-I of FIG. 3B.

Referring to FIG. 3A, the LED module 100 includes a wiring substrate 110, a LED 20, a metallic plate 30, and a sealing resin 40.

The wiring substrate 110 includes a resin film 111, a bonding layer 112, wiring layers 113A and 113B, connecting portions 114A and 114B, plating layers 115A and 115B, and an insulating layer 116.

The wiring substrate 110 is connected to the wiring layers 31A and 31B of the metallic plate 30 while the LED 20 is mounted on the wiring substrate 110. The LED 20 and the wiring substrate 110 are coated by a sealing resin 40 on the metallic plate 30.

The resin film 111 is made of, for example, polyimide. The resin film 111 is an example of a resin substrate. Onto the upper surface of the resin film 111, the wiring layers 113A and 113B are attached by the bonding layer 112.

Referring to FIG. 3A, the bonding layer 112 exists only in a center portion of the wiring substrate 110 in its width direction. The bonding layer 112 does not exist between the wiring layers 113A and 113B and does not substantially exist between the connecting portions 114A and 114B.

The bonding layer 112 is used to bond the wiring layers on an upper surface of the resin film 111. The adhesive layer 112 is, for example, a heat resistant adhesion bond made of an insulative resin such as an epoxy adhesion bond or a polyimide adhesion bond.

The wiring layers 113A and 113B are formed in association with the terminals 21 and 22 of the LED 20. For example, the wiring layers 113A and 113B are formed by patterning a copper foil, which is adhered to the upper surface of the resin film 111 by the bonding layer 112, using a photolithography process.

The plating layers 115A and 115B are formed on the upper surfaces of the wiring layers 113A and 113B. The insulating layer 116 is formed on a part of the wiring layers 113A and 113B, which does not overlap the LED 20 in its plan view. The part of the wiring layers 113A and 113B is positioned on an outside of the upper surface of the wiring substrate 110 in width directions 110 of the wiring substrate 110. The connecting portions 114A and 114B are connected to the lower surfaces of the wiring layers 113A and 113B.

The terminals 21 and 22 of the LED 20 are connected to the upper surfaces of the wiring layers 113A and 113B via the plating layers 115A and 115B, respectively.

Upper parts of the connecting portions 114A and 114B are connected to lower parts of the wiring layers 113A and 113B. The connecting portions 114A and 114B are made by forming a copper plating film on the lower surfaces of the wiring layers 113A and 113B by performing electrolytic plating while supplying electric power to the wiring layers 113A and 113B.

The connecting portions 114A and 114B are examples of first connecting portion and a second connecting portion, respectively. The plating layers 115A and 115B are formed on the side surfaces and the lower surfaces of the connecting portions 114A and 114B, respectively.

The lower surfaces of the connecting portions 114A and 114B are connected to the wiring layers 31A and 31B via the plating layers 115A and 115B and the solder 32A and the solder 32B.

The plating layers 115A and 115B are formed on the part of the upper surfaces of the wiring layers 113A and 113B where the insulating layers are not formed, and the side and lower surfaces of the connecting portions 114A and 114B.

The plating layers 115A and 115B are examples of the first plating layer and the second plating layer, respectively.

The plating layer 115A has a double-layered structure of a nickel plating layer 115A1 and a gold plating layer 115A2. The plating layer 115B has a double-layered structure of a nickel plating layer 115B1 and a gold plating layer 115B2.

For example, the nickel plating layer 115A1 is formed on the part of the upper surfaces of the wiring layer 113A where the insulating layer 116 is not formed, and the side and lower surfaces of the connecting portion 114A. Further, the gold plating layer 115A2 is formed by providing a gold plating film on the surface of the nickel plating layer 115A1 by, for example, the electrolytic plating process.

For example, the nickel plating layer 115B1 is formed on the part of the upper surface of the wiring layer 113B where the insulating layer 116 is not formed, and the side and lower surfaces of the connecting portion 114B. Further, the gold plating layer 115B2 is formed by providing a gold plating film on the surface of the nickel plating layer 115B1 by, for example, the electrolytic plating process.

The material forming the insulating layer 116 may be obtained by adding a filler or a pigment such as titanium oxide ($TiO_2$) or barium sulfate ($BaSO_4$) to, for example, an epoxy resin or a silicone resin such as organopolysiloxane. The insulative resin of the insulating layer 116 may be a white ink made of the material of the insulative resin.

The insulating layer 116 is shaped to be like a rectangular frame. The LED 20 is provided in a rectangular opening portion 116A in a center of the insulating layer 116. When the insulating layer 116 is made of a white ink, it is possible to improve a reflectance ratio and a heat radiation rate thereby improving illuminance and heat radiation capability. Said differently, in this case, the insulating layer 116 functions as a reflective film.

A positional relationship among the LED 20, the resin layer 33, the wiring layers 113A and 113B, and the insulating layer 116 is as illustrated in FIG. 3B.

The above described wiring substrate of the first embodiment is mounted on the metallic plate 30 by the solder 32A and the solder 32B while the LED 20 is mounted on the upper surface of the wiring substrate 110. While the wiring substrate 110 is mounted on the metallic plate 30, the outer side surfaces of the plating layers 115A and 115B and the lower surface of the plating layers 115A and 115B are connected to the wiring layers 31A and 31B by the solder 32A and the solder 32B.

The LED 20 and the wiring substrate 110 are coated by the sealing resin 40.

As described, the LED module 100 of the first embodiment is completed. Thus, electric power is supplied to the LED 20 via the wiring layer 31A and 31B to enable the LED 20 to light.

Further, in the wiring substrate 110 of the first embodiment, the plating layers 115A and 115B are formed below the lower and side surfaces of the respective connecting portions 114A and 114B. Thus, wettability below the lower and side surfaces of the connecting portions 114A and 114B can be improved.

Therefore, the solder 32A and the solder 32B extend on side surfaces of the wiring substrate 110 to thereby increase connection strength of the solder 32A and the solder 32B. Thus, connection reliability of the solder 32A and the solder 32B can be improved.

Further, in the wiring substrate 110 of the first embodiment, the wiring layers 113A and 113B are formed by patterning the copper foil, which is adhered to the resin film 111 by the bonding layer 112, using a photolithography process or the like. Thus, a distance between the wiring layers 113A and 113B can be made short. Said differently, the wiring layers 113A and 113B can be finely formed.

Hereinafter, a manufacturing method of the wiring substrate 110 of the first embodiment is described. Further, a reason why the wiring layers 113A and 113B are finely formed is described.

FIGS. 4 to 9 illustrate the manufacturing process of the wiring substrate 110 of the first embodiment.

Here, it is described that a mode of manufacturing the wiring substrate 110 of the first embodiment by a reel-to-reel method using a polyimide insulating resin tape as base material.

Figure 4:
FIG. 4 illustrates a manufacturing process of the wiring substrate 110 of the first embodiment.
Figure 4:
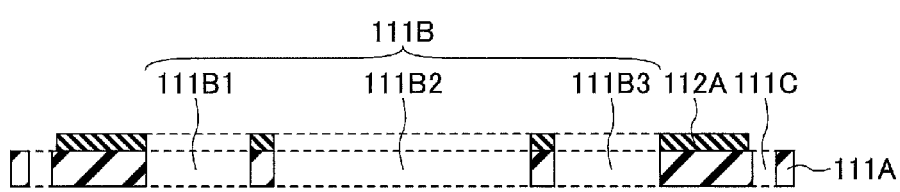
Figure 4:
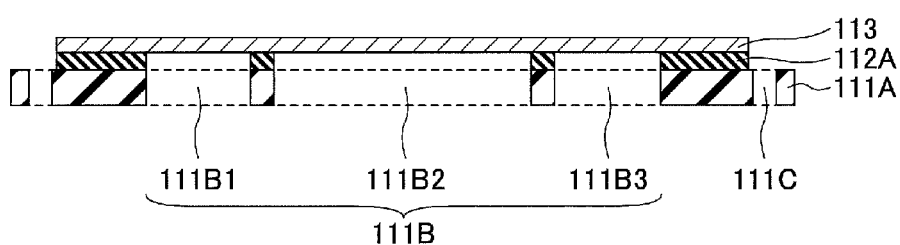
Figure 4:
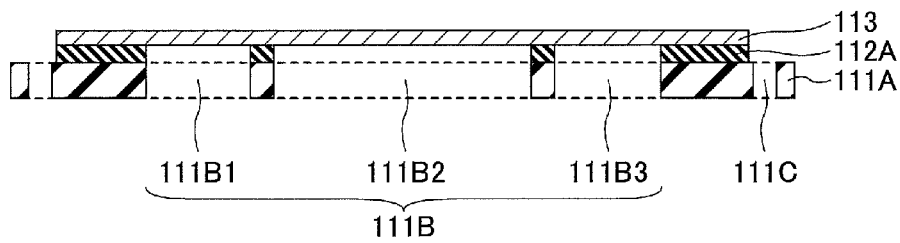
Figure 6:
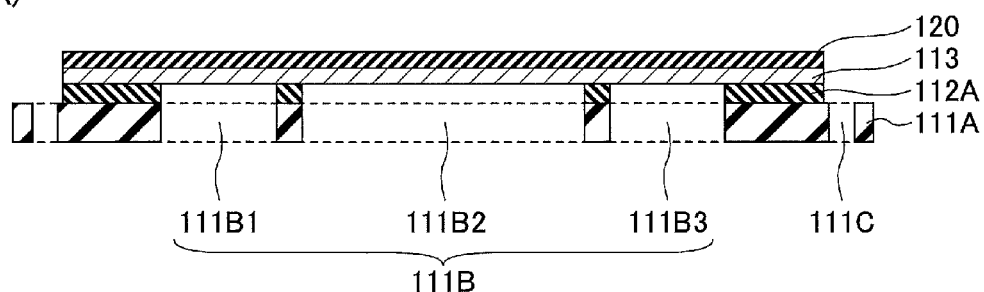
FIG. 6 illustrates the manufacturing process of the wiring substrate 110 of the first embodiment.
Figure 6:
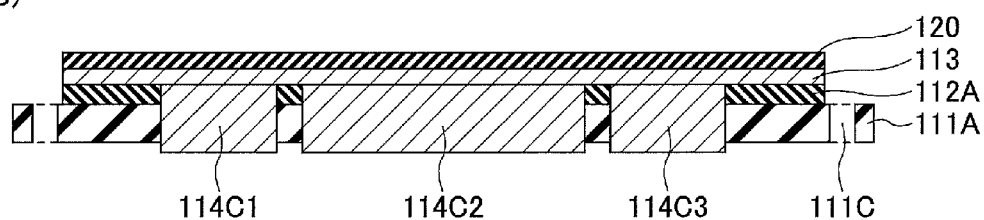
Figure 6:
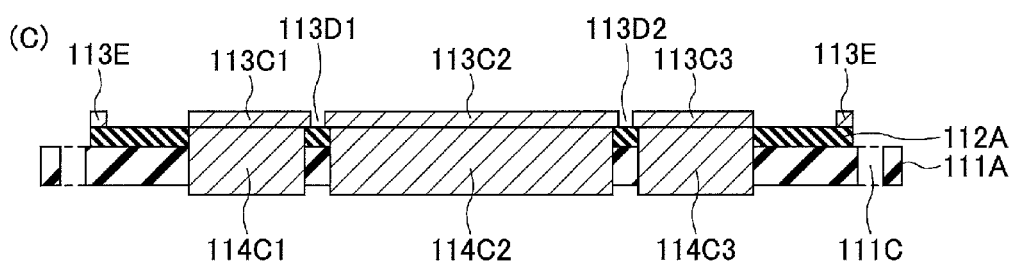
Figure 6:
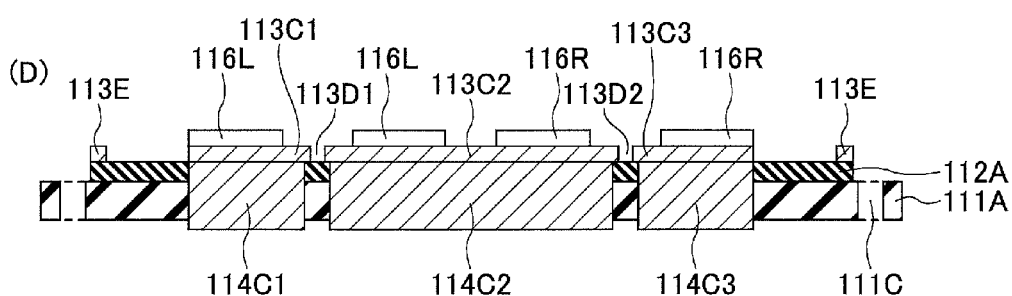
Figure 8:
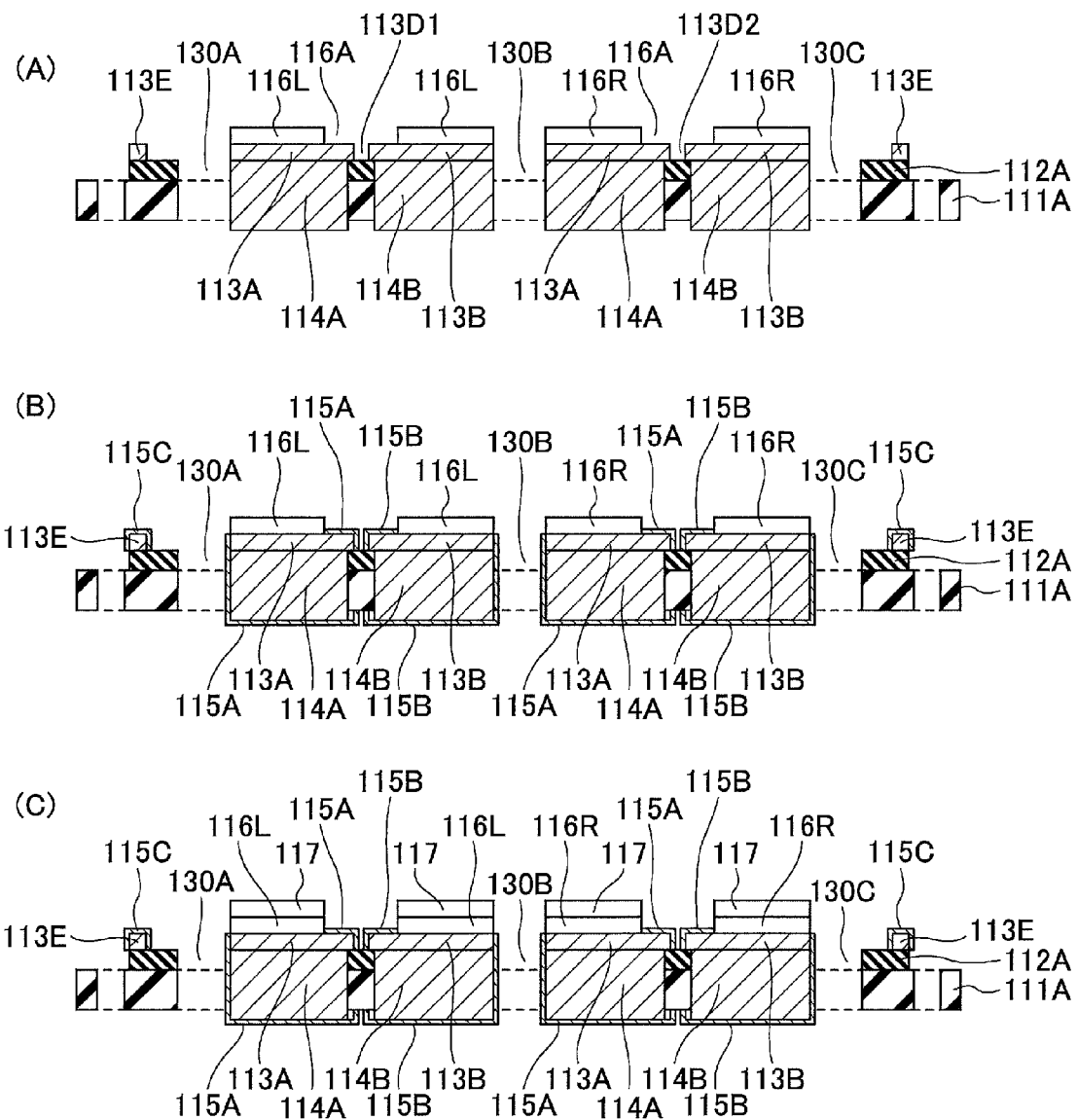
FIG. 8 illustrates the manufacturing process of the wiring substrate 110 of the first embodiment.

Cross-sectional views illustrated in FIGS. 4, 6, and 8 correspond to a cross-sectional view of a couple of the wiring substrates, which are illustrated in FIG. 3A and arranged side by side. The explanation is given on the premise that the couple of the wiring substrates 110 are obtained from the cross-sectional structure illustrated in FIGS. 4, 6, and 8, and the plurality of wiring substrates 110 arranged in two rows in the longitudinal direction of the polyimide insulating resin tape are obtained.

As illustrated in (A) of FIG. 4, a bonding layer 112A is formed by coating an adhesion bond on the front surface (the upper surface in FIG. 4) of the resin film 111A. Instead of coating the adhesive layer, an adhesive film may be attached to the front surface of the resin film 111A.

Referring to (B) of FIG. 4, three through holes 111B1, 111B2, and 111B3 are formed by a punching process. When the through holes 111B1, 111B2, and 111B3 are not specifically distinguished, these through holes are correctively referred to as a through hole 111B.

These three through holes 111B1, 111B2, and 111B3 penetrate both of the resin film 111A and the bonding layer 112A. In this process, sprocket holes 111C used in manufacturing the wiring substrate 110 are simultaneously formed by the punching process.

Figure 5:
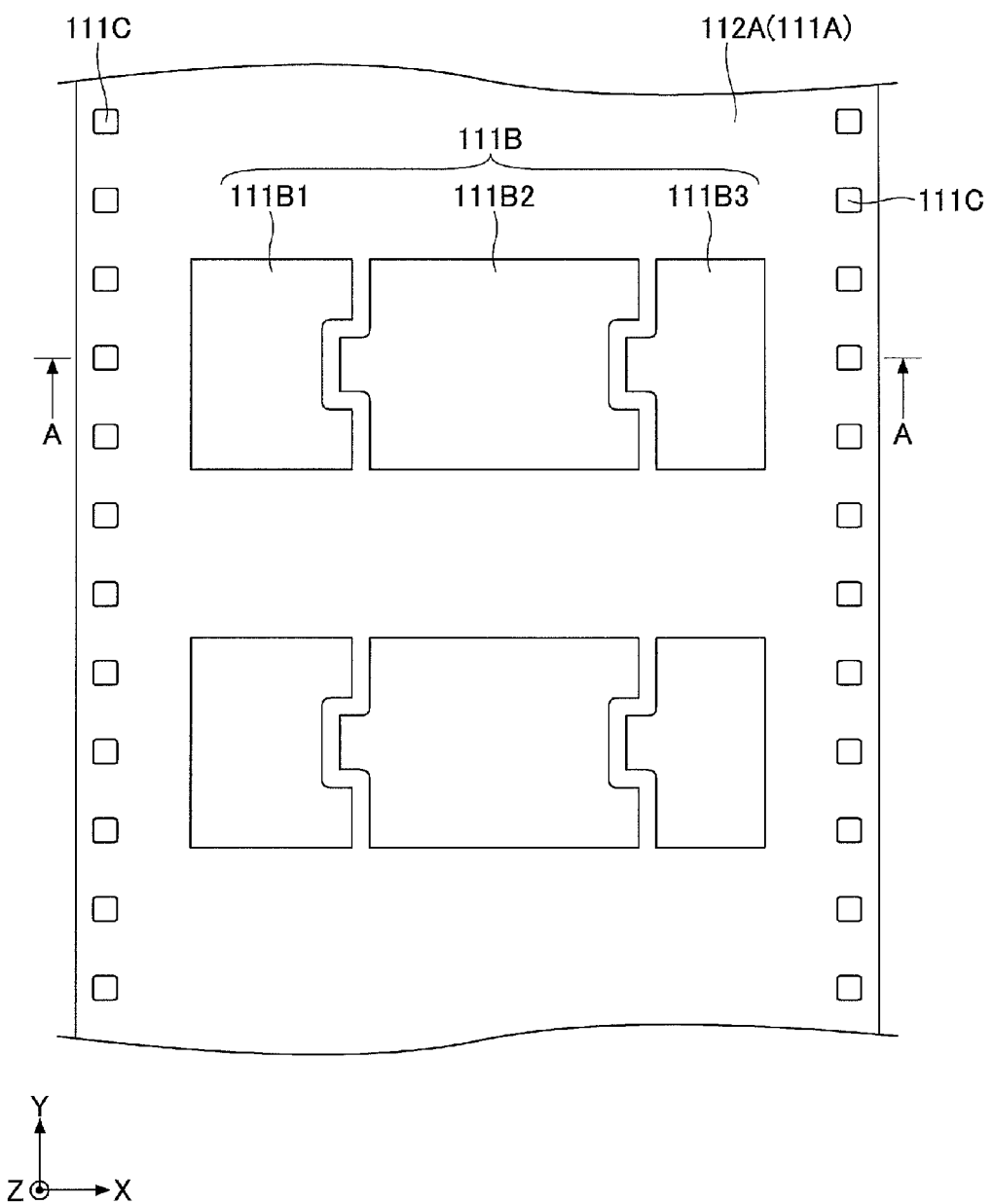
FIG. 5 illustrates the manufacturing process of the wiring substrate 110 of the first embodiment.

The cross-sectional view illustrated in (B) of FIG. 4 is a cross-sectional view taken along a line indicated by arrows A-A illustrated in FIG. 5. FIG. 5 is a plan view of the laminated body of the resin film 111A and the bonding layer 112A viewed from an upper side to the lower side of the laminated body. Although the upper surface of the bonding layer 112A is illustrated in FIG. 5, the resin film 111A exists on the lower side of the bonding layer 112A. Therefore, the reference symbol 111A is indicated by inserting in parentheses.

Referring to FIG. 5, a XYZ coordinate system is defined as an orthogonal coordinate system. The X-axis direction is the width direction in (B) of FIG. 4. The Y-axis direction is the direction perpendicularly penetrating (B) of FIG. 4. The Z-axis direction is the thickness direction in (B) of FIG. 4. The resin film 111A is a film having a longitudinal direction along the Y direction.

Referring to FIG. 5, the three through holes 111B1, 111B2, and 111B3 are arranged in the X-axis direction. The three through holes 111B1, 111B2, and 111B3 are arranged interposing a predetermined gap in the Y-axis direction.

The through hole 111B1 has an opening portion in a rectangular shape having a recess in its plan view. The through hole 111B2 has an opening portion in a rectangular shape having a protrusion and a recess in its plan view. The through hole 111B3 has an opening portion in a rectangular shape having a protrusion in its plan view.

The recess of the through hole 111B1 is arranged so as to face the protrusion of the through hole 111B2. The recess of the through hole 111B2 is arranged so as to face the protrusion of the through hole 111B3. The length of the through hole 111B1 and the length of the through hole 111B3 along the X-axis in the cross-sectional view taken along the line indicated by the arrows A-A are equal. The length of the through hole 111B2 along the X-axis in the cross-sectional view taken along the line indicated by the arrows A-A is two times longer than each of the lengths of the through hole 111B1 and 111B3 along the X-axis in the cross-sectional view taken along the line indicated by the arrows A-A.

In the punching process illustrated in (B) of FIG. 4, the through holes 111B1, 111B2, and 111B3 are formed.

Next, as illustrated in (C) of FIG. 4, a copper foil 113 is adhered onto the bonding layer 112. The copper foil 113 has a thickness of, for example, 12 µm to 35 µm. The copper foil 113 becomes the wiring layers 113A and 113B by being patterned on a later process.

Referring to (D) of FIG. 4, by impregnating the wiring board 110 with a solution for wet etching, portions of the lower surface of the copper foil 113 facing the through holes 111B and the upper surface of the copper foil 113 are etched. By etching the wiring board 110, an anticorrosive agent existing on the surface of the copper foil 113 is removed, and the surface of the copper foil 113 is slightly removed in the thickness direction (for example, 1 µm to 2 µm). The etching process may be performed when it is preferable to do so.

Next, as illustrated in (A) of FIG. 6, a masking tape is adhered onto the upper surface of the copper foil 113, and connecting portions 114C1, 114C2, and 114C3 are made grow by electrolytic plating using the copper foil 113.

The connecting portions 114C1, 114C2, and 114C3 are formed to be a thick columnar shape by causing a plating metal to precipitate on the back surface of the copper foil 113, which is exposed inside the through holes 111B1, 111B2, and 111B3. Under a state in which the connecting portions 114C1, 114C2, and 114C3 are formed, the upper ends of the through holes 111B1, 111B2, and 111B3 are caulked by the copper foil 113.

By supplying a plating metal inside the through holes 111B1, 111B2, and 111B3, columnar connecting portions 114C1, 114C2, and 114C3 are completed. The connecting portions 114C1, 114C2, and 114C3 are formed by supplying copper plating inside the through holes 111B1, 111B2, and 111B3 by, for example, electrolytic copper plating to precipitate copper plating on the back surface of the copper foil 113.

The through holes 111B1, 111B2, and 111B3 penetrate through the resin film 111A and the bonding layer 112A to thereby cause the back surface of the copper foil 113 to be exposed. The connecting portions 114C1, 114C2, and 114C3 are formed to be a columnar shape by penetrating through both of the resin film 111A and the bonding layer 112A.

The upper ends of the connecting portions 114C1, 114C2, and 114C3 are connected to the copper foil 113, and the other ends of the connecting portions 114C1, 114C2, and 114C3 (the lower ends in FIG. 6) is exposed on the back surface of the resin film 111A. As an example, the other ends of the connecting portions 114C1, 114C2, and 114C3 (the lower ends in FIG. 6) protrude on the back surface of the resin film 111A.

However, the other ends (the lower ends in FIG. 6) of the connecting portions 114C1, 114C2, and 114C3 may be arranged on the same plane as the back surface of the resin film 111A, or may be arranged on an inner side from the back surface of the resin film 111A.

The masking tape 120 covers the upper surface of the copper foil 113 to prevent a copper layer from growing on the upper surface side of the copper foil 113 when the connecting portions 114C1, 114C2, and 114C3 are grown by the electrolytic plating. The electrolytic plating is performed by supplying power to the copper foil 113.

Next, the masking tape 120 is removed, and a resist (not illustrated) is coated on the copper foil 113. The wiring substrate 110 having a pattern of the copper foil 113 is exposed to light thereby developing the pattern of the copper foil 113 on the resist. Further, by etching the wiring substrate 110 using the resist, the copper foil 113 is patterned. Thus, the copper foils 113C1, 113C2, and 113C3 are formed as illustrated in (C) of FIG. 6. Referring to (C) of FIG. 6, the masking tape 120 is removed after the copper foil 113 is patterned and the copper foils 113C1, 113C2, and 113C3 are formed.

Referring to (C) of FIG. 6, the copper foils 113C1, 113C2, and 113C3 are divided into three parts by the border portions 113D1 and 113D2. The border portions 113D1 and 113D2 are minute intervals (gaps) unlike the connecting portions 14A and 14B. The minute intervals of the border portions 113D1 and 113D2 cannot be made of the silver paste formed by screen printing and can be formed by photolithography developing the photosensitive resist in a pattern of the copper foil 113. Because the photolithography is used for microfabrication of semiconductor elements, the widths of the border portions 113D1 and 113D2 can be made minute to thereby finely form the border portions 113D1 and 113D2. Therefore, the wiring substrate 110 can be miniaturized along with miniaturization of the LED 20.

Further, in a case where the copper foils 113C1, 113C2, and 113C3 are formed as illustrated in FIG. 6, power supply lines 113E are formed on outer sides of the copper foils 113C1 and 113C3.

Figure 7:
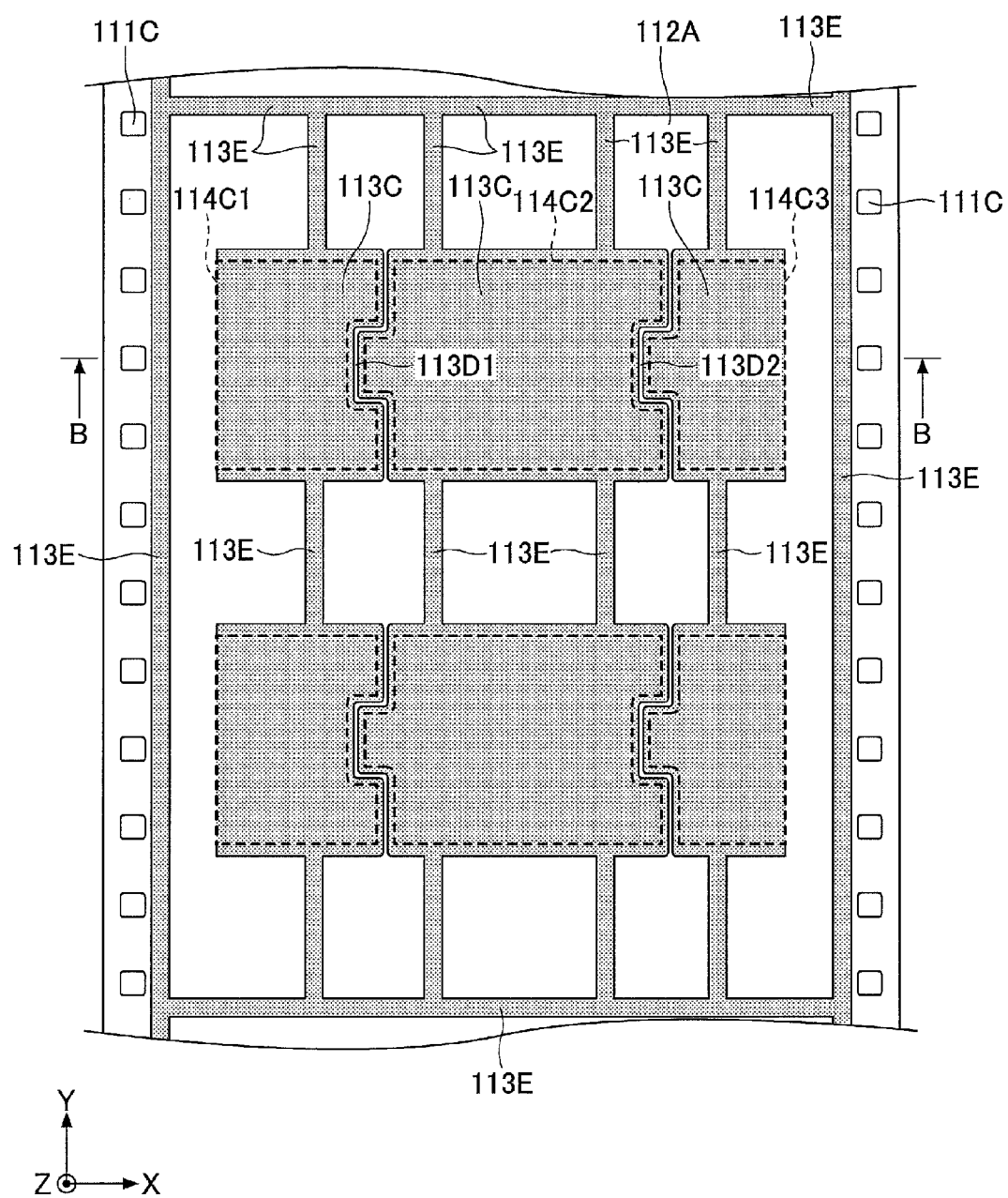
FIG. 7 illustrates the manufacturing process of the wiring substrate 110 of the first embodiment.

The cross-sectional view illustrated in (C) of FIG. 6 is taken along a line designated by arrows B-B illustrated in FIG. 7. FIG. 7 is a plan view illustrating a pattern of the copper foils 113C1, 113C2, and 113C3.

The copper foils 113C1, 113C2, and 113C3 exist in an area indicated by the gray (shade). The power supply lines 113E are connected to the copper foils 113C1, 113C2, and 113C3. Referring to FIG. 7, a part of the power supply lines 113E are connected to a couple of the copper foils 113C1, a couple of the copper foils 113C2, and a couple of the copper foils 113C3, and another part of the power supply lines 113E surrounds the couple of the copper foils 113C1, the couple of the copper foils 113C2, and the couple of the copper foils 113C3. The power supply lines 113E are left in etching illustrated in (C) of FIG. 6 to supply electricity at a time of forming a plating layer in a later stage. The power supply line 113E is removed before dicing to be performed in the later stage.

Profiles (contours) of the connecting portions 114C1, 114C2, and 114C3 formed inside the through holes 111B1, 111B2, and 111B3 (see FIG. 5) are illustrated by broken lines. The connecting portions 114C1, 114C2, and 114C3 are connected on the lower surfaces of the copper foils 113C1, 113C2, and 113C3 as illustrated in (C) of FIG. 6.

Referring to FIG. 7, the copper foils 113C1, 113C2, and 113C3 are divided into three parts by the border portions 113D1 and 113D2. The border portion 113D1 is in a border between the copper foil 113C1 on the connecting portion 114C1 and the copper foil 113C2 of the connecting portion 114C2 and is bend in a crank-like shape.

In a manner similar to the above, the border portion 113D2 is in a border between the copper foil 113C2 on the connecting portion 114C2 and the copper foil 113C3 of the connecting portion 114C3 and is bend in a crank-like shape.

The width of the border portions 113D1 and 113D2 (the widths in the X-axis direction) is, for example, about 50 µm.

As illustrated in (D) of FIG. 6, insulating layers 116L and 116R are formed on predetermined portions on the copper foils 113C1, 113C2, and 113C3 (portions on which the plating layers 115A and 115B are not formed later inside the area of the wiring substrate 110 to be diced). For example, if the insulating layers 116L and 116R are a white-colored ink, the insulating layers 116L and 116R may be formed by a screen printing method. For example, if the insulating layers 116L and 116R are other than the white-colored ink, the insulating layers 116L and 116R may be formed by a screen printing method or the like.

Further, the insulating layers 116L and 116R may be formed by a method other than the screen printing method. After forming the insulating layers 116L and 116R so as to coat the copper foils 113C1, 113C2, and 113C3, the opening portions exposing the copper foils 113C1, 113C2, and 113C3 where the plating layers 115A and 115B are formed may be formed in the insulating layers 116L and 116R.

The insulating layer 116L is provided on the left side in (D) of FIG. 6. The insulating layer 116R is provided on the right side in (D) of FIG. 6. For convenience in explanation, the two insulating layers 116 are arranged in the cross-sectional view. Therefore, the insulating layers 116L and 116R are distinguished. When the insulating layers 116L and 116R are not distinguished, the insulating layer 116 may be used in the explanation.

Figure 9:
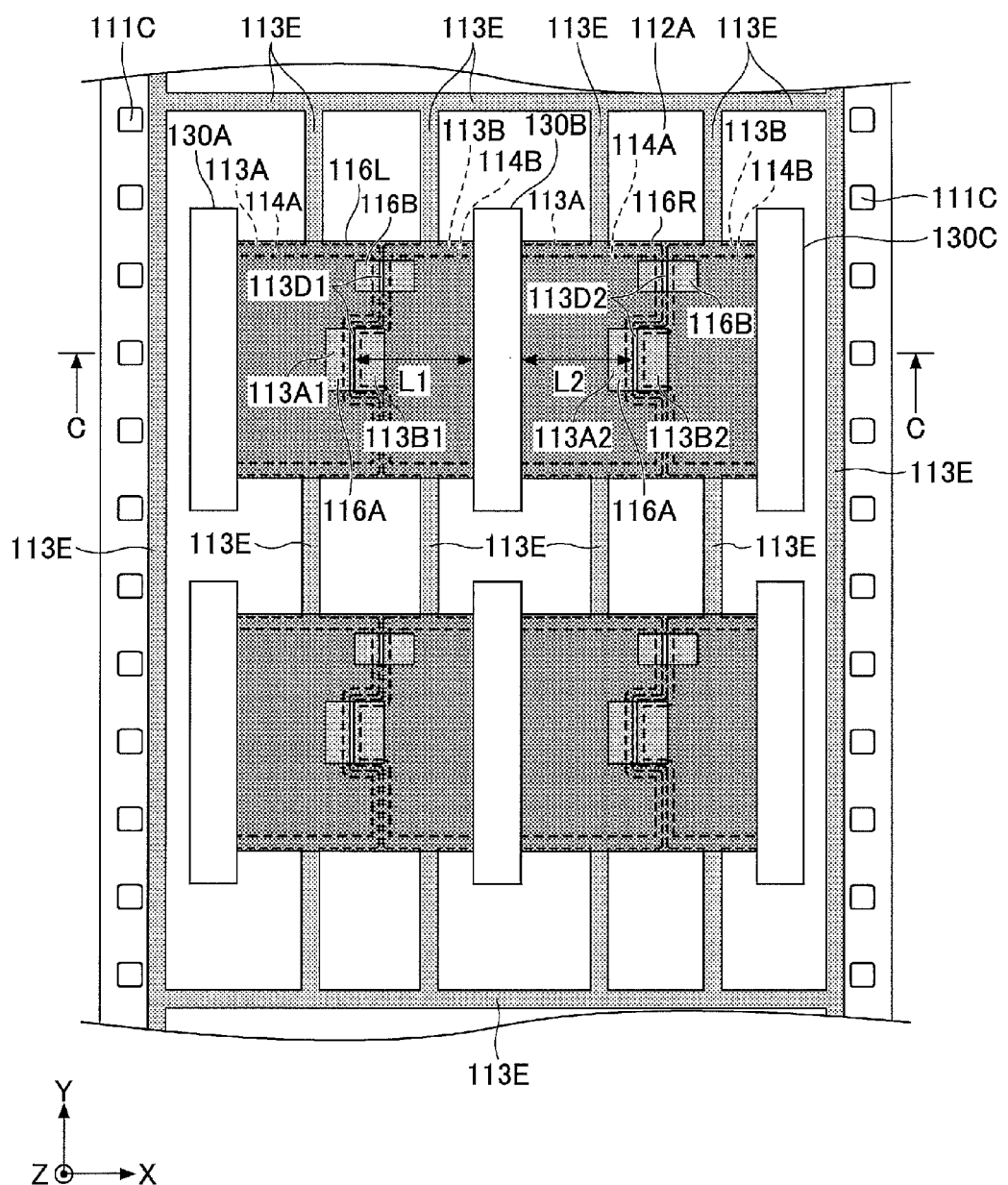
FIG. 9 illustrates the manufacturing process of the wiring substrate 110 of the first embodiment.

Next, referring to (A) of FIG. 8 and FIG. 9, the slits 130A, 130B, and 130C are formed.

The cross-sectional view illustrated in (A) of FIG. 8 is taken along a line C-C of FIG. 9. FIG. 9 is a plan view illustrating a positional relationship among the slits 130A, 130B, and 130C and the insulating layers 116L and 116R.

Referring to FIG. 9, the two insulating layers 116L and 116R are arranged in the X-axis direction. Referring to FIG. 9, the two insulating layers 116L are arranged in the Y-axis direction, and the two insulating layers 116R are arranged in the Y-axis direction of the resin film 111A elongated in the Y-axis direction. Referring to FIG. 9, four insulating layers 116 (two insulating layers 116L and two insulating layers 116R) are illustrated.

The insulating layers 116L and 116R are formed in the portions indicated by gray in FIG. 9. Each of the insulating layers 116L and 116R has an opening portion 116A in the center and an opening portion 116B on a side in the positive direction along the Y-axis from the center.

The slits 130A, 130B, and 130C illustrated in (A) of FIG. 8 and FIG. 9 may be formed by, for example, stamping.

Referring to FIG. 9, the longitudinal axis of the slit 130A may be arranged in the Y direction on the side in the negative direction of the X-axis of the insulating layer 116L. The slit 130A penetrates through the copper foil 113C1 and the connecting portion 114C1 (see (D) of FIG. 6).

The slit 130A is formed along a side of the insulating layer 116L extending along the Y-axis on the side in the negative direction of the X-axis.

By forming the slits 130A, a part of the copper foil 113C1 and a part of the connecting portion 114C1 (see (D) of FIG. 6) are removed. Referring to (A) of FIG. 8 and FIG. 9, a part remaining on the side in the positive direction of the X-axis becomes the wiring layer 113A and the connecting portion 114A.

The slit 130B is formed to have the longitudinal direction in the Y-axis direction in the center of the widths of the copper foil 113C2 and the connecting portion 114C2 (see (D) of FIG. 6). The slit 130B penetrates through the copper foil 113C2 and the connecting portion 114C2.

By forming the slit 130B, a part remaining on the side in the negative direction of the X-axis of the copper foil 113C2 and the connecting portion 114C2 (see (D) of FIG. 6) become the wiring layer 113B and the connecting portion 114B. Meanwhile, a part remaining on the side in the positive direction of the X-axis of the copper foil 113C2 and the connecting portion 114C2 becomes the wiring layer 113A and the connecting portion 114A.

The wiring layers 113B and 113A are divided right and left into two layers by the slit 130B on the line C-C indicated by the arrows C. The slit 130B is formed so that the length L1 of the wiring layer 113B equals to the length L2 of the wiring layer 113A on the line C-C.

Referring to FIG. 9, the longitudinal axis of the slit 130C may be arranged in the Y direction on the side in the positive direction of the X-axis of the insulating layer 116R. The slit 130C penetrates through the copper foil 113C3 and the connecting portion 114C3 (see (D) of FIG. 6).

The slit 130C is formed along a side of the insulating layer 116R extending along the Y-axis on the side in the positive direction of the X-axis.

By forming the slits 130C, a part of the copper foil 113C3 and a part of the connecting portion 114C3 (see (D) of FIG. 6) are removed. Referring to (A) of FIG. 8 and FIG. 9, a part remaining on the side in the negative direction of the X-axis becomes the wiring layer 113B and the connecting portion 114B.

Here, the slit 130B is an example of the first slit. The slits 130A and 130C are examples of a second slit.

The copper foil 113 is an example of a metallic foil. In the copper foil 113, a part (the copper foil 113C2) positioned between the border portions 113D1 and 113D2 in the X-axis direction is an example of a first side of the metallic foil.

In the copper foil 113, a part (the copper foil 113C1) positioned on the side in the negative direction of the X-axis from the border portion 113D1 and a part (the copper foil 113C3) positioned on the side in the positive direction of the X-axis from the border portion 113D2 are examples of a second side of the metallic foil.

Referring to FIG. 9, the recess 113A1 of the wiring layer 113A and the protrusion 113B1 of the wiring layer 113B are exposed inside the opening portion 116A of the insulating layer 116L in its plan view. The border portion 113D1 exists between the recess 113A1 of the wiring layer 113A and the protrusion 113B1 of the wiring layer 113B. Therefore, the border portion 113D1 is exposed inside the opening portion 116A of the insulating layer 116L.

Referring to FIG. 9, the opening portion 116B is formed on the side in the positive direction of the Y-axis from the opening portion 116A of the insulating layer 116L. The border portion 113D1 is exposed inside the opening portion 116B of the insulating layer 116L. However, because the border portion 113D1 is formed to be in a crank-like shape, the position of the opening portion 116B in the direction of the X-axis is offset on the side in the positive direction of the X-axis from the opening portion 116A.

Referring to FIG. 9, the recess 113A2 of the wiring layer 113A and the protrusion 113B2 of the wiring layer 113B are exposed inside the opening portion 116A of the insulating layer 116L in its plan view. The border portion 113D2 exists between the recess 113A2 of the wiring layer 113A and the protrusion 113B2 of the wiring layer 113B. Therefore, the border portion 113D2 is exposed inside the opening portion 116A of the insulating layer 116R.

Referring to FIG. 9, the opening portion 116B is formed on the side in the positive direction of the Y-axis from the opening portion 116A of the insulating layer 116R. The border portion 113D2 is exposed inside the opening portion 116B. However, because the border portion 113D2 is formed to be in a crank-like shape, the position of the opening portion 116B in the direction of the X-axis is offset on the side in the positive direction of the X-axis from the opening portion 116A.

Terminals 21 and 22 of the LED 20 are connected to the recess 113A1 of the wiring layer 113A and the protrusion 113B1 of the wiring layer 113B, which are exposed inside the opening portion 116A of the insulating layer 116L.

Terminals 21 and 22 of the LED 20 are connected to the recess 113A1 of the wiring layer 113A and the protrusion 113B1 of the wiring layer 113B, which are exposed inside the opening portion 116A of the insulating layer 116R. One terminal of the terminals 21 and 22 is connected to a positive terminal of a power source (not illustrated), and the other terminal of the terminals 21 and 22 is connected to a negative terminal of the power source.

For example, a Zener diode may be connected in parallel with the LED 20 so that Zener diode is connected to the wiring layers 113A and 113B exposed inside the opening portions 116B of the insulating layers 116L and 116R. When the Zener diode is not connected, the opening portions 116B may not be formed.

The wiring substrate 110 may be diced along the outer peripheries of the insulating layers 116L and 116R.

Referring to (B) of FIG. 8, a plating layer 115C is formed on the surfaces of the wiring layers 113A and 113B and the surfaces of the connecting portions 114A and 114B. The plating layers 115A, 115B, and 115C are formed.

The plating layers 115A, 115B, and 115C are formed by sequentially forming a nickel plating layer and a gold plating layer in this order on, for example, the surfaces of the wiring layer 113A and 113B formed by a copper plating film, the surfaces of the connecting portions 114A and 114B, and the surface of the power supply line 113E. For convenience, referring to (B) of FIG. 8, the plating layer 115A, 115B, and 115C are exemplified as single layers.

The plating layers 115A and 115B are formed by electrolytic plating while electric power is supplied to the wiring layer 113A and 113B and the connecting portions 114A and 114B via the power supply line 113E. At this time, the plating layer 115C is formed on the surface of the power supply line 113E.

The electric power is supplied to the wiring layers 113A and 113B and the connecting portions 114A and 114B by connecting the power supply line 113E (see FIG. 7) to an external power source.

Portions of the surfaces of the wiring layer 113A and the surfaces of the connecting portion 114A, which are not coated by the resin film 111A, the bonding layer 112A, or the insulating layer 116L or 116R, are coated by the plating layer 115A.

Referring to (B) of FIG. 8, two pairs of the wiring layers 113A and the connecting portions 114A are illustrated. The wiring layer 113A and the connecting portion 114A, which are positioned below the insulating layer 116L, and the wiring layer 113A and the connecting portion 114A, which are positioned below the insulating layer 116R, are coated by the plating layers 115A. The plating layers 115A are formed on the side surfaces of the wiring layers 113A and side surfaces of the connecting portions 114A, which are exposed inside the slits 130A and 130B.

Portions of the surfaces of the wiring layer 113B and the surfaces of the connecting portion 114B, which are not coated by the resin film 111A, the bonding layer 112A, or the insulating layer 116L or 116R, are coated by the plating layer 115B.

Referring to (B) of FIG. 8, two pairs of the wiring layers 113B and the connecting portions 114B are illustrated. The wiring layer 113B and the connecting portion 114B, which are positioned below the insulating layer 116L, and the wiring layer 113B and the connecting portion 114B, which are positioned below the insulating layer 116R, are coated by the plating layers 115B. The plating layers 115B are formed on the side surfaces of the wiring layers 113B and side surfaces of the connecting portions 114B, which are exposed inside the slits 130B and 130C.

With this, a tape-like (sheet-like) wiring substrate 110A is completed.

Finally, referring to (C) of FIG. 8, a solder resist layer 117 is formed on the insulating layers 116L and 116R. For example, the solder resist layer 117 may be formed by printing a sheet-like solder resist layer previously having the same shape (in its plan view) as the insulating layers 116L and 116R on the insulating layers 116L and 116R.

The process illustrated in (C) of FIG. 8 is an arbitrary process. When the solder resist layer 117 is not formed, the manufacturing process of the wiring substrate 110A of the first embodiment may be completed in the process illustrated in (B) of FIG. 8.

It is possible to obtain two wiring substrates 110 from the wiring substrate 110A having the cross-sectional views illustrated in (B) and (C) of FIG. 8 by dicing the wiring substrate 110A. The cross-sectional structures of two wiring substrates 110 are similar to the wiring substrate 110 included in the LED module 100 illustrated in FIG. 3A.

Further, in the wiring substrate 110 of the first embodiment, the plating layers 115A and 115B are formed below the lower and side surfaces of the respective connecting portions 114A and 114B. Thus, wettability below the lower and side surfaces of the connecting portions 114A and 114B can be improved.

Therefore, the solder 32A and the solder 32B (see FIG. 3A) extend onto the side surfaces of the wiring substrate 110 to thereby increase connection strength of the solder 32A and the solder 32B. Thus, connection reliability of the solder 32A and the solder 32B can be improved.

Further, in the wiring substrate 110 of the first embodiment, the wiring layers 113A and 113B are formed by patterning the copper foil, which is adhered to the upper surface of the resin film 111 by the bonding layer 112, using photolithography or the like. Thus, a distance between the wiring layers 113A and 113B can be made short. Said differently, the wiring layers 113A and 113B can be finely formed.

The reason why the wiring layers 113A and 113B can be finely formed is that the border portions 113D1 and 113D2 between the wiring layers 113A and 113B are formed by photolithography.

Because the photolithography is used for microfabrication of semiconductor elements, the widths of the border portions 113D1 and 113D2 can be made minute to thereby finely form the border portions 113D1 and 113D2.

For example, the wiring substrate 10 (see FIG. 1) of the comparative example 1 is formed by printing the wiring layers 12A and 12B on the front surface of the ceramic board 11. As such, there is a limit in finely forming the wiring layers 12A and 12B. Therefore, it is difficult to form a minute gap between the wiring layers 12A and 12B.

Although it is technically possible to conduct photolithography by vapor deposition to form the wiring layers 12A and 12B on the front surface of the ceramic board 11, the manufacturing cost of a process of vapor-depositing the wiring layers 12A and 12B on the ceramic board is very high.

Further, it is difficult to finely form the stage 60A and the lead 60B in the IC module 1B of the comparative example 2.

In comparison with the comparative examples 1 and 2, the wiring substrate 110 of the first embodiment is formed by adhering the copper foil 113 onto the front surface of the resin film 111, in which the through hole 111B (see (C) of FIG. 4) is formed, and the connecting portions 114C1 to 114C3 (see (B) of FIG. 6) are formed inside the through holes 111B and on the lower surface of the copper foil 113.

Further, the wiring layers 113A and 113B are formed by patterning the copper foil 113 by photolithography or the like and forming the slits 130A to 130C to thereby obtain the wiring layers 113A and 113B and the connecting portions 114A and 114B.

Therefore, the border portions 113D1 and 113D2 of the wiring portions 113A and 113B can be finely formed.

Further, by dicing the tape-like (sheet-like) wiring substrate 110A (see (B) of FIG. 8), the large number of the wiring substrates 110 can be produced.

Therefore, the wiring substrate 110 can be manufactured at a low cost.

Further, in the wiring substrate 110 of the first embodiment, the connecting portions 114C1, 114C2, and 114C3 (see (D) of FIG. 6) are divided by the slits 130A to 130C (see (A) of FIG. 8). Thus, the connecting portions 114A and 114B included in the wiring substrate 110 as a final product are formed.

Therefore, side surfaces of the connecting portions 114A and 114B exist in both ends of the wiring substrate 110.

Therefore, referring to (B) of FIG. 8, by forming the plating layers 115A and 115B by electrolytic plating on the outer surfaces of the connecting portions 114A and 114B, the wiring substrate 110 having the plating layers 115A and 115B on the side surfaces of the both ends can be manufactured.

Because the plating layers 115A and 115B are formed on the side surfaces on both of the ends of the wiring substrate 110, connection strength with the solder 32A and the solder 32B can be improved. Thus, connection reliability using the solder 32A and the solder 32B can be improved.

Further, in the wiring substrate 10 of the comparative example 1 (see FIG. 1), the wiring layers 12A and 12B, the electrodes 13A and 13B, and the connecting portions 14A and 14B are formed along the outer peripheral surface of the ceramic board 11. Therefore, heat conductivity of the ceramic board 11 is low thereby preventing heat generated by the LED 20 from being efficiently transmitted to the metallic plate 30.

This is because heat generated by the LED 20 is not mostly transferred to the metallic plate 30 via the ceramic board 11. Instead, the heat generated by the LED 20 is mostly transferred to the metallic plate 30 via the wiring layers 12A and 12B, the electrodes 13A and 13B, and the connecting portions 14A and 14B, which are formed on the outer peripheral surfaces of the ceramic board 11.

In comparison with the comparative example 1, in the wiring substrate 110 of the first embodiment (see FIG. 3A), the connecting portions 114A and 114B are formed on substantially entire lower surfaces of the wiring layers 113A and 113B in the thickness direction to the bottom surface of the wiring substrate 110. The connecting portions 114A and 114B formed by the copper plating films have very high heat conductivity in comparison with the ceramic board 11 of the comparative example 1.

The lower surfaces of the connecting portions 114A and 114B are connected to the wiring layers 31A and 31B via the plating layers 115A and 115B and the solder 32A and the solder 32B.

Therefore, it is possible to efficiently transfer heat generated by the LED 20 to the metallic plate 30 thereby achieving very high heat radiation capability. Therefore, the LED module 100 (see FIG. 3A) including the wiring substrate 110 of the first embodiment has very high heat radiation efficiency.

Further, in the wiring substrate 10 of the comparative example 1, the wiring layers 12A and 12B and the plating layers 15A and 15B are formed on the ceramic board 11, and the terminals 21 and 22 of the LED 20 are connected to the plating layers 15A and 15B. The LED 20 and the wiring substrate 10 are coated by the sealing resin 40.

Therefore, there is a probability that the connection between the plating layers 15A and 15B and the terminals 21 and 22 is affected by a difference of linear expansion coefficients among the wiring layers 12A and 12B, the plating layers 15A and 15B, the ceramic board 11, and the sealing resin 40 when the wiring substrate is heated and thereafter is cooled to seal by the sealing resin 40.

Meanwhile, in the wiring substrate 110 of the first embodiment, the connecting portions 114A and 114B are connected to substantially the entire surfaces of the wiring layers 113A and 113B, and the resin film 111 connects the connecting portion 114A to the connecting portion 114B. Therefore, an influence on the connection caused by the difference of the linear expansion coefficient is restricted more than that in the wiring substrate of the comparative example 1.

A mode of adhering the copper foil 113 (see (C) of FIG. 4) onto the resin film 111 by the bonding layer 112 is described above. However, if a resin film to which the copper foil is previously adhered is used, the bonding layer 112 is not used for the adhesion.

In this case, three through holes 111B1, 111B2, and 111B3 may be formed by laser processing from the lower surface side of the resin film 111 instead of forming the three through holes 111B1, 111B2, and 111B3 illustrated in (B) of FIG. 4 by a punching process.

[b] Second Embodiment

Figure 10:
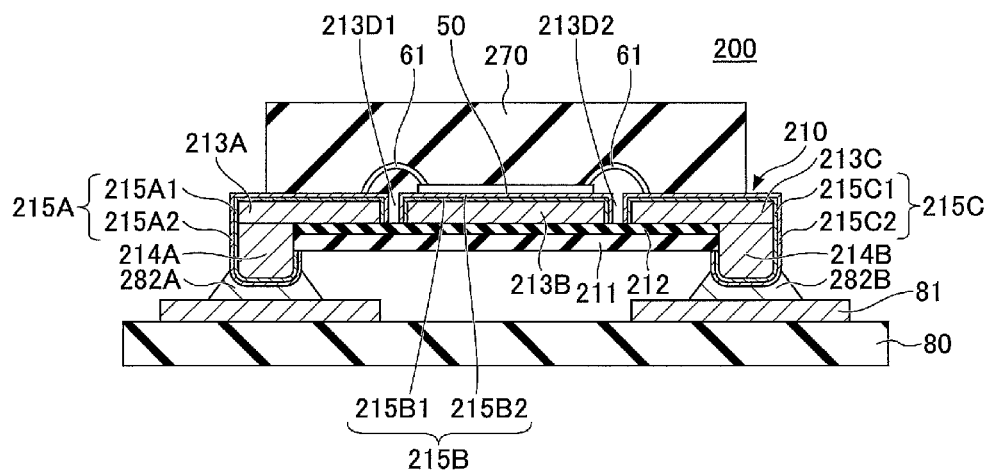
FIG. 10 is a cross-sectional view of an IC module 200 of a second embodiment.

FIG. 10 is a cross-sectional view of an IC module 200 of a second embodiment.

The IC module 200 includes an IC chip 50, a wiring substrate 210, a molding resin 270, and a circuit board 80 as major components. Within the second embodiment, the same reference symbols are attached to the same components as those of the IC module 1B of the comparative example 2, and description of the components is omitted.

The wiring substrate 210 includes a resin film 211, a bonding layer 212, wiring layers 213A, 213B, and 213C, connecting portions 214A and 214B, and plating layers 215A, 215B, and 215C.

The resin film 211 is similar to the resin film 111 of the first embodiment. The resin film 211 is made of, for example, a polyimide resin 211.

The bonding layer 212 is similar to that in the first embodiment. The bonding layer may be used to attach a copper foil to the resin film 211.

The wiring layers 213A, 213B, and 213C may be formed by patterning the copper foil adhered to the resin film 211 in a manner similar to the wiring layers 113A and 113B of the first embodiment. Border portions 213D1 and 213D2 of the wiring layers 213A, 213B, and 213C form a minute gap, which is finely formed by photolithography or the like.

The connecting portions 214A and 214B are made by forming through holes at positions on back surfaces of the resin film corresponding to the wiring layers 213A and 213D and further by forming copper plating films inside the through holes by electrolytic plating.

The plating layers 215A, 215B, and 215C are plating layers formed by electrolytic plating while supplying electric power to the wiring layers. 213A, 213B, and 213C in a manner similar to the plating layers 115A and 115B of the first embodiment. The plating layers 215A, 215B, and 215C may be made by forming nickel plating layers 215A1, 215B1, and 215C1 and gold plating layers 215A1, 215B2, and 215C2 in these order on the wiring layers 215A2, 215B2, and 215C2.

An IC chip 50 is mounted on the wiring layer 213B of the wiring substrate 210 of the second embodiment. Terminals of the IC chip 50 are connected to the wiring layers 213A and 213C by bonding wires. Then, the IC chip 50 and upper surfaces of the wiring layers 213A, 213B, and 213C are covered by a molding resin 270.

Because the plating layers 215A and 215C are formed on front and side surfaces of the connecting portions 214A and 214B. Therefore, the connecting portions 214A and 214B may be connected to the wiring layers 81 of the circuit board 80.

As described, because the wiring substrate 210 of the second embodiment has a structure similar to the wiring substrate 110 of the first embodiment, the border portions 213D1 and 213D2 among the wiring layers 213A, 213B, and 213C can be finely formed. Therefore, the wiring substrate 210 can be miniaturized along with miniaturization of the IC chip 50.

In a manner similar to the wiring substrate 110 of the first embodiment, a large amount of the wiring substrates 210 can be manufactured by dicing a tape-like (sheet-like) wiring substrate 210 after making the tape-like (sheet-like) wiring substrate 210.

Therefore, the wiring substrate 210 can be manufactured at a low cost.

Therefore, by forming the plating layers 215A and 215C by electrolytic plating on the outer surfaces of the connecting portions 214A and 214B, the wiring substrate 210 having the plating layers 215A and 215C on the side surfaces of the both ends can be manufactured.

Because the plating layers 215A and 215C are formed on the side surfaces on both of the ends of the wiring substrate 210, connection strength with the solder 82A and the solder 82B can be improved. Thus, connection reliability using the solder 82A and the solder 82B can be improved.

[c] Third Embodiment

Figure 11:
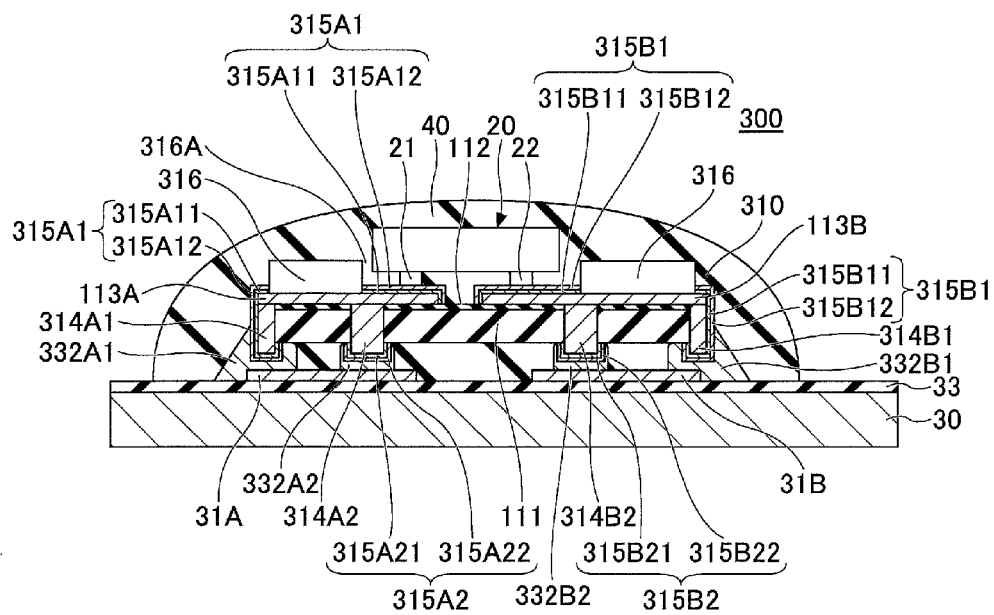
FIG. 11 illustrates a cross-sectional structure of a LED module 300 including a wiring substrate 310 of a third embodiment 3.

FIG. 11 illustrates a cross-sectional structure of a LED module 300 including a wiring substrate 310 of a third embodiment. The wiring substrate 31 of the third embodiment is a modification of the wiring substrate 110 of the first embodiment. Therefore, the same reference symbols are given to the same components as those of the wiring substrate 110 of the first embodiment, and description of these portions is omitted.

The LED module 300 includes a wiring substrate 310, a LED 20, a metallic plate 30, and a sealing resin 40.

The wiring substrate 310 includes a resin film 111, a bonding layer 112, wiring layers 113A and 113B, connecting portions 314A1, 314A2, 314B1, and 314B2, plating layers 315A1, 315A2, 315B1, and 315B2, and an insulating layer 316.

The wiring substrate 310 is connected to the wiring layers 31A and 31B of the metallic plate 30 while the LED 20 is mounted on the wiring substrate 310. The LED 20 and the wiring substrate 310 are coated by a sealing resin 40 on the metallic plate 30.

Referring to FIG. 11, within the third embodiment, the bonding layer 112 may exist in a central portion in a middle of the wiring substrate in the width direction, may exist between the connecting portions 314A1 and 314A2, and may exist between the connecting portions 314B1 and 314B2.

The plating layers 315A1 and 315B1 are formed on the upper surfaces of the wiring layers 113A and 113B. The insulating layers 316 are formed on parts of the wiring layers 113A and 113B, which do not overlap the LED 20 in its plan view (outside portions of the upper surface of the wiring substrate 310 in the width direction).

The plating layer 315A1 is continuously formed on the side and lower surfaces of the connecting portion 314A1. The plating layer 315B1 is continuously formed on the side and lower surfaces of the connecting portion 314B1.

The connecting portions 314A1, 314A2, 314B1, and 314B2 are connected to the lower surfaces of the wiring layers 113A and 113B. The connecting portions 314A1, 314A2, 314B1, and 314B2 are shaped like a column and made by plating in a manner similar to the connecting portions 114A and 114B. The connecting portions 314A1, 314A2, 314B1, and 314B2 are shaped as if the connecting portions 314A and 314B of the first embodiment are divided into two parts in their width directions.

The terminals 21 and 22 of the LED 20 are connected to the upper surfaces of the wiring layers 113A and 113B via the plating layers 315A1 and 315B1, respectively.

Upper portions of the connecting portions 314A1, 314A2, 314B1, and 314B2 are connected to the lower surfaces of the wiring layers 113A and 113B. For example, the connecting portions 314A, 314A2, 314B1, and 314B2 are made by forming a copper plating film on the lower surfaces of the wiring layers 113A and 113B by performing electrolytic plating while supplying electric power to the wiring layers 113A and 113B.

The connecting portions 314A and 314B are examples of the first connecting portion and the second connecting portion, respectively. The plating layers 315A and 315B are formed on the side and lower surfaces of the connecting portions 314A1 and 314B1, respectively.

The lower surfaces of the connecting portions 314A1 and 314B1 are connected to the wiring layers 31A and 31B via the plating layers 315A1 and 315B1 and the solder 332A and the solder 332B.

The plating layers 315A2 and 315B2 are formed on the lower surfaces of the connecting portions 314A2 and 314B2, respectively.

The lower surfaces of the connecting portions 314A2 and 314B2 are connected to the wiring layers 31A and 31B via the plating layers 315A2 and 315B2 and the solder 332A and the solder 332B.

The plating layers 315A1 and 315B1 are formed on the part of the upper surfaces of the wiring layers 113A and 113B where the insulating layers 316 are not formed, and the side and lower surfaces of the connecting portions 314A1 and 314B1.

The plating layers 315A1 and 315B1 are examples of the first plating layer and the second plating layer, respectively.

The plating layers 315A1 and 315B1 has a two layered structure of nickel plating layers 315A11 and 315B11 and gold plating layers 315A12 and 315B12.

Similarly, the plating layers 315A2 and 315B2 has a two layered structure of nickel plating layers 315A21 and 315B21 and gold plating layers 315A22 and 315B22.

For example, the material forming the insulating layer 316 may be obtained by adding a filler or a pigment such as titanium oxide ($TiO_2$) or barium sulfate ($BaSO_4$) to an epoxy resin or a silicone resin such as organopolysiloxane. The insulative resin of the insulating layer 316 may be a white ink made of the material of the insulative resin.

The insulating layer 316 is shaped to be like a rectangular frame. The LED 20 is provided in a rectangular opening portion 316A in a center of the insulating layer 316. If the insulating layer 316 is made of the white ink, it is possible to improve the reflectance ratio and the heat radiation rate of the insulating layer 316 to thereby improve the illuminance and the heat radiation capability of the LED 20. Said differently, in this case, the insulating layer 316 functions as a reflective film.

The above described wiring substrate of the third embodiment is mounted on the metallic plate 30 by solder 332A1, solder 332A2, solder 332B1, and, solder 332B1 while the LED 20 is mounted on the upper surface of the wiring substrate 310 of the third embodiment.

While the wiring substrate 310 is mounted on the metallic plate 30, the outer side surfaces of the plating layers 315A1 and 315B1 and the lower surface of the plating layers 315A1 and 315B1 are connected to the wiring layers 31A and 31B by the solder 332A1 and the solder 332B1. Further, the lower surfaces of the plating layers 315A2 and 315B2 are connected to the wiring layers 31A and 31B by the solder 332A2 and the solder 332B2.

The LED 20 and the wiring substrate 310 are coated by the sealing resin 40.

As described, the LED module 300 of the third embodiment is completed. Thus, electric power is supplied to the LED 20 via the wiring layers 31A and 31B to enable the LED 20 to light.

Further, in the wiring substrate 310 of the third embodiment, the plating layers 315A1 and 315B1 are formed below the lower and outer side surfaces of the respective connecting portions 314A1 and 314B1. Thus, wet below the lower and side surfaces of the connecting portions 314A1 and 314B1 can be improved.

Therefore, the solder 332A1 and the solder 332B1 extend on the side surfaces of the wiring substrate 310 to thereby increase connection strength of the solder 332A1 and the solder 332B1. Thus, connection reliability of the solder 332A and the solder 332B can be improved.

Further, in the wiring substrate 310 of the third embodiment, the wiring layers 113A and 113B are formed by patterning the copper foil, which is adhered to the upper surface of the resin film 111 by the bonding layer 112, using photolithography or the like. Thus, a distance between the wiring layers 113A and 113B can be made very short. Said differently, the wiring layers 113A and 113B can be finely formed.

Thus, it is possible to provide a wiring substrate, on which a plurality of wirings is formed interposing a minute gap between the wirings, and a manufacturing method of the wiring substrate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A module comprising:
a wiring substrate and;
an electronic part mounted on the wiring substrate,
wherein the wiring substrate includes
a resin substrate;
a metallic foil that is formed on one surface of the resin substrate, and is separated into a first side metallic foil and a second side metallic foil by a border portion which is disposed to face the electronic part;
a first connecting portion that is formed by a plating film, is connected to the first side metallic foil on one side of the resin substrate, and is disposed in a thickness direction of the resin substrate;
a second connecting portion that is formed by a plating film, is connected to the second side metallic foil on another side of the resin substrate, and is disposed in the thickness direction of the resin substrate;
a first plating layer that is directly formed on a front surface and a side surface of the first side metallic foil, and a bottom surface and a side surface of the first connecting portion; and
a second plating layer that directly is formed on a front surface and a side surface of the second side metallic foil, and a bottom surface and a side surface of the second connecting portion,
wherein the side surface of the first side metallic foil and the side surface of the first connecting portion form a first side surface of the resin substrate, and
wherein the side surface of the second side metallic foil and the side surface of the second connecting portion form a second side surface of the resin substrate, which is arranged in parallel with first side surface of the resin substrate.

2. The module according to claim 1, further comprising:
an insulating layer formed in surfaces of the first side metallic foil and the second side metallic foil.

3. The module according to claim 1,
wherein the metallic foil is a copper foil,
the first connecting portion and the second connecting portion are formed by a copper plating film, and
the first plating layer and the second plating layer are plating layers formed by a set of a nickel layer and a gold layer which are arranged in this order.

4. The module according to claim 1,
wherein the resin substrate is a tape-like resin substrate.

5. The module according to claim 1,
wherein a shape of the first side metallic foil and a shape of the first connecting portion are matched, and a shape of the second side metallic foil and a shape of the second connecting portion are matched.

\* \* \* \* \*